(12) United States Patent
Huang et al.

(10) Patent No.: US 11,315,827 B2
(45) Date of Patent: Apr. 26, 2022

(54) SKIP VIA CONNECTION BETWEEN METALLIZATION LEVELS

(71) Applicant: INTERNATIONAL BUSINESS MACHINES CORPORATION, Armonk, NY (US)

(72) Inventors: Huai Huang, Saratoga, NY (US); Lawrence A. Clevenger, Saratoga Springs, NY (US); Hosadurga Shobha, Niskayuna, NY (US); Christopher J. Penny, Saratoga Springs, NY (US); Nicholas Anthony Lanzillo, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 184 days.

(21) Appl. No.: 16/813,162

(22) Filed: Mar. 9, 2020

(65) Prior Publication Data
US 2021/0280456 A1 Sep. 9, 2021

(51) Int. Cl.
*H01L 21/768* (2006.01)
*H01L 23/48* (2006.01)

(52) U.S. Cl.
CPC .. *H01L 21/76807* (2013.01); *H01L 21/76816* (2013.01); *H01L 21/76837* (2013.01); *H01L 21/76843* (2013.01); *H01L 23/481* (2013.01)

(58) Field of Classification Search
CPC ......... H01L 21/76807; H01L 21/76816; H01L 21/76837; H01L 21/76843; H01L 23/481; H01L 21/76834; H01L 21/76852; H01L 23/5283; H01L 21/76897; H01L 23/5226; H01L 21/76885
See application file for complete search history.

(56) References Cited

U.S. PATENT DOCUMENTS

| | | |
|---|---|---|
| 9,601,426 B1 | 3/2017 | Bonilla et al. |
| 10,009,992 B2 | 6/2018 | Vrtis et al. |
| 10,109,526 B1 | 10/2018 | Zhang et al. |
| 10,157,833 B1 | 12/2018 | Zhang et al. |
| 10,306,760 B2 | 5/2019 | Li et al. |
| 2005/0041405 A1 | 2/2005 | Kawagoe |
| 2009/0236143 A1 | 9/2009 | Nakamura |
| 2018/0114752 A1* | 4/2018 | Briggs .............. H01L 21/76831 |

FOREIGN PATENT DOCUMENTS

| | | |
|---|---|---|
| JP | 2015053350 A | 3/2015 |
| JP | 5693339 B2 | 4/2015 |

* cited by examiner

*Primary Examiner* — Robert G Bachner
(74) *Attorney, Agent, or Firm* — Tutunjian & Bitetto, PC; Randall Bluestone

(57) ABSTRACT

A method for fabricating a semiconductor device including a skip via connection between metallization levels includes subtractively etching first conductive material to form a first via and a skip via on a first conductive line. The first via and the first conductive line are included within a first metallization level. The skip via is used to connect the first metallization level to a third metallization level above a second metallization level. The method further includes forming, on the first via from second conductive material, a second via disposed on a second conductive line. The second via and the second conductive line are included within the second metallization level.

20 Claims, 10 Drawing Sheets

SKIP VIA CONNECTION BETWEEN METALLIZATION LEVELS

BACKGROUND

The present invention generally relates to semiconductor devices, and more particularly to skip via connections between metallization levels and methods of forming the same.

Generally, semiconductor devices can include a plurality of circuits which form an integrated circuit fabricated on a substrate. A complex network of signal paths can be routed to connect the circuit elements distributed on the surface of the substrate. Efficient routing of these signals can include the formation of multilevel or multilayered schemes (e.g., single or dual damascene wiring structures) during the back-end-of-line (BEOL) phase of manufacturing. Within an interconnect structure, conductive vias can run perpendicular to the substrate and conductive lines can run parallel to the substrate.

SUMMARY

In accordance with an embodiment, a method for forming a semiconductor device including a skip via connection between metallization levels is provided. The method includes subtractively etching first conductive material to form a first via and a skip via on a first conductive line. The first via and the first conductive line are included within a first metallization level. The skip via is used to connect the first metallization level to a third metallization level above a second metallization level. The method further includes forming, on the first via from second conductive material, a second via disposed on a second conductive line. The second via and the second conductive line are included within the second metallization level.

In accordance with another embodiment, a semiconductor device including a skip via connection between metallization levels is provided. The device includes a first conductive line having a geometry resulting from a subtractive etch process, and a first via and a skip via disposed on the first conductive line. The first via and the first conductive line are included within a first metallization level. The skip via connects a first metallization level to a third metallization level above a second metallization level. The second metallization level includes a second via on a second conductive line disposed on the first via.

In accordance with yet another embodiment, a semiconductor device including a skip via connection between metallization levels is provided. The device includes a first conductive line having a geometry resulting from a damascene trench formation process, and a first via and a skip via disposed on the first conductive line. The first via and the first conductive line are included within a first metallization level. The skip via connects a first metallization level to a third metallization level above a second metallization level. The second metallization level includes a second via on a second conductive line disposed on the first via.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
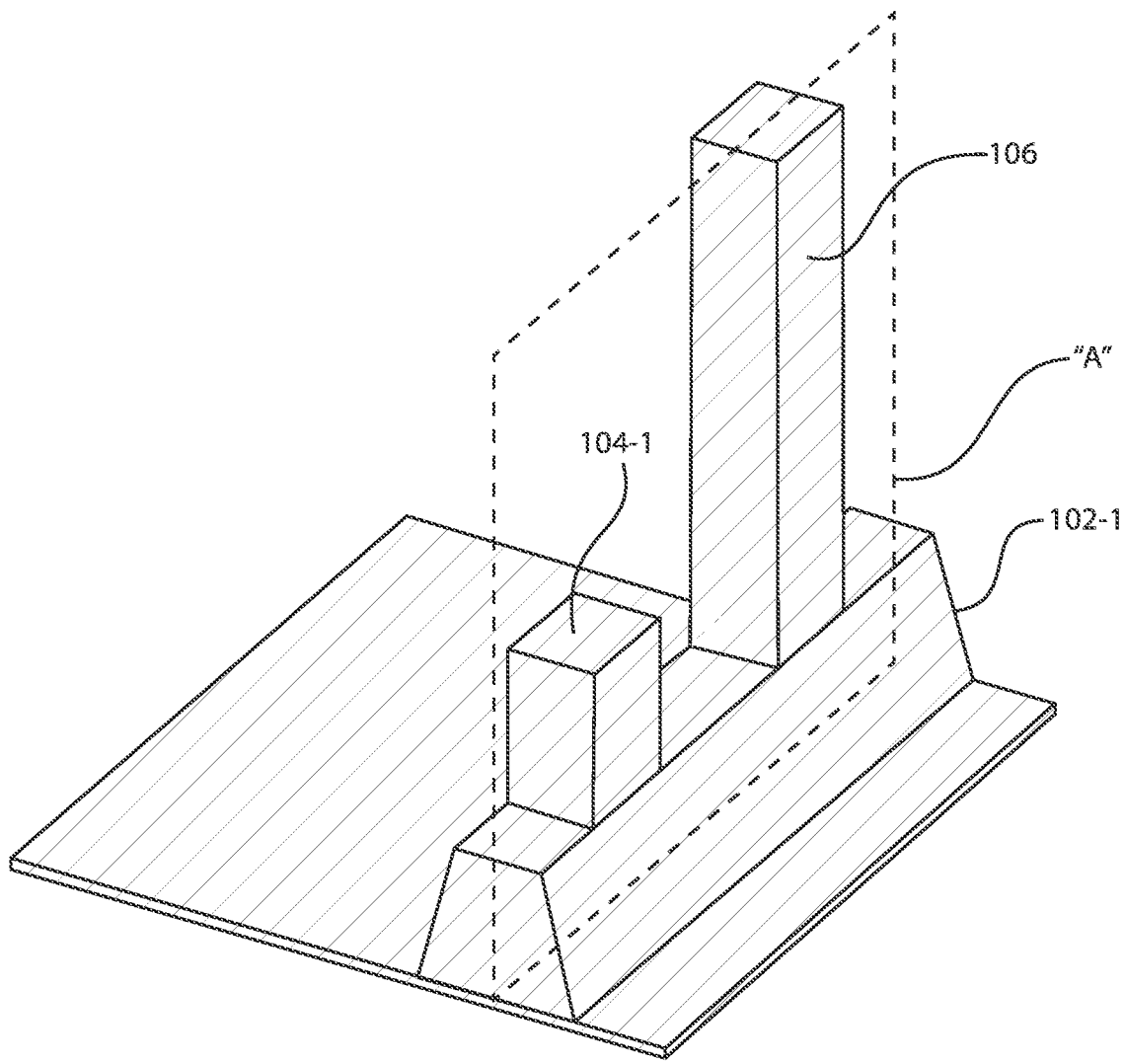
FIG. 1 is a perspective view of the formation of a first metallization level including a conductive line and via, and a skip via, during the fabrication of a semiconductor device, in accordance with an embodiment of the present invention.

A semiconductor device can include multiple metallization levels ("levels"), each including a conductive line ("line") formed in an interlevel dielectric layer (ILD). Although the term metallization is used herein, metallization levels can be formed to include any suitable conductive material in accordance with the embodiments described herein. Upper lines can be connected to lower lines by vias. Levels can be identified herein using the designation X, where X is a positive integer from 1 to N. The levels are identified from the level closest to the substrate to the level furthest from the substrate as 1 through N where 1 is the first or lowermost level and N is the last or uppermost level. A line in the X level is designated as an $M_X$ line, and a via in the X level is designated as a $V_{(X-1)}$ via. Note that there are no $V_0$ vias or via bars. When a line in an upper level is designated $M_X$, then a line in an immediately lower level can be designated $M_{(X-1)}$. Likewise, when a line in a lower level is designated $M_X$, then a line in an immediately higher level is designated $M_{(X+1)}$. For a first level (X=1), the line is $M_1$ and there are no "$V_0$" vias as the connection from $M_1$ to devices below $M_1$ is generally made through separately formed contacts in a contact layer ("CA"). For a second level (X=2), the line is $M_2$ and the vias are $V_1$ and, for a third level (X=3), the line is $M_3$ and the vias or via bars are $V_2$.

The embodiments described herein provide for the fabrication of a skip via, also referred to herein as a super via, in a subtractive etch back-end-of-line (BEOL) integration scheme. A skip via in accordance with the embodiments described herein can provide a connection between conductive lines of respective metallization levels in a manner that bypasses an intermediate metallization level. More specifically, a skip via $SV_X$ can connect an $M_X$ line to an $M_{X+2}$ line, thereby bypassing the X+1 level and the corresponding $M_{(X+1)}$ line. The embodiments described herein can eliminate high resistance barrier interfaces and can enable frequency enhancement for FPG (e.g., about 2% frequency enhancement). Additionally, the embodiments described herein can provide for a hybrid dual damascene $M_{(X+2)}$ line landing on the skip via $SV_X$ and the line $M_{(X+1)}$.

The skip via can provide design benefits for BEOL interconnects, and the subtractive etch of conductive materials with a skip via can provide additional design flexibility.

One example of design flexibility in some embodiments is the ability to implement non-copper (Cu) conductive materials that can be subtractive etched to form the skip via, referred to herein as alternate conductive materials. Examples of alternate conductive materials include, but are not limited to, ruthenium (Ru), cobalt (Co), etc.

Another example of design flexibility in some embodiments is choice of conductive materials. For example, if a skip via $SV_X$ includes Ru, then (1) the via $V_X$ can include Ru and the via $V_{(X+1)}$ can include Ru; (2) the via $V_X$ can include Ru and the via $V_{(X+1)}$ can include Cu, etc. In one embodiment, an initial metal (e.g., Ru) can be deposited as a blanket to minimize resistivity, which can allow for a Cu line $M_X$ to land directly on a high-quality via (e.g., Ru via), thereby further minimizing via resistance. Accordingly, the subtractive etch scheme described herein can accommodate the use of a variety of conductive materials (e.g., metals) during metallization.

Yet another example of design flexibility in some embodiments is that subtractive and damascene and metallization techniques can be co-integrated in accordance with the embodiments described herein to customize the formation of the metallization levels. For example, although the skip via $SV_X$ described herein is formed using a subtractive etch scheme, the conductive lines $M_X$ and the $M_{(X+2)}$ in contact with $SV_X$ can themselves be formed using a combination of subtractive etch schemes and/or damascene schemes (e.g., filling a trench with conductive material).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
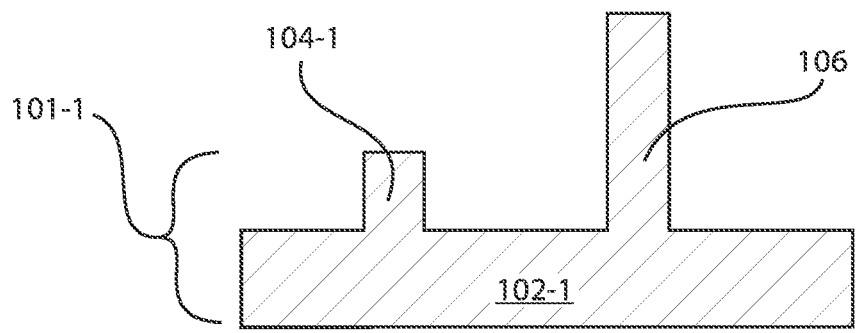
FIG. 2 is a cross-sectional view through the device shown in FIG. 1, in accordance with an embodiment of the present invention.

Referring now to the drawings in which like numerals represent the same or similar elements and initially to FIGS. 1 and 2, a semiconductor device 100 is shown having a first metallization level 101-1 that includes a conductive line 102-1 and a via 104-1 disposed on the conductive line 102-1, and a skip via 106 disposed on the conductive line 102-1. More specifically, FIG. 1 depicts a perspective view of the device 100, and FIG. 2 depicts a cross-sectional view of the device 100 through plane "A" shown in FIG. 1.

The conductive line 102-1, the via 104-1 and the skip via 106 can include any suitable conductive material(s) in accordance with the embodiments described herein. Examples of suitable conductive materials that can be used to form the conductive line 102-1, 104-1 and 106 include, but are not limited to, copper (Cu), ruthenium (Ru), cobalt (Co), etc. In one embodiment, the conductive line 102-1 can include the same conductive material as the via 104-1 and/or the skip via 106. In another embodiment, the conductive line 102-1 can include a different conductive material than the via 104-1 and/or the skip via 106.

As shown, the conductive line 102-1 can be in the shape of a trapezoidal prism including two trapezoid bases connected by four rectangular lateral faces. More specifically, each of the two trapezoidal bases can be in the form of an isosceles trapezoid in which the two legs connecting the top trapezoid base to the bottom trapezoid base have the same length.

In this illustrative embodiment, the conductive line 102-1, the via 104-1 and the skip via 106 are formed using a subtractive etch process on a block of conductive material. Here, the top trapezoid base has a shorter length than the bottom trapezoid base. After the conductive line 102-1 is formed, the via 104-1 and the skip via 106 can be formed. For example, a subtractive etch can be used with a first block mask to form a first pillar and a second pillar. Then, planarization material can be formed, a second block mask can be formed across the second pillar, and a subtractive etch can be performed on the first pillar to form the conductive via 104-1. The second pillar corresponds to the skip via 106. For example, the planarization material can include a suitable organic dielectric layer (ODL). Then, the remaining portions of the planarization material and the mask can be removed resulting in the device 100 shown in FIG. 1.

The subtractive etch process used herein can vary depending on the type of conductive material used. For example, if the conductive material includes ruthenium (Ru), the subtractive etch process can illustratively employ a dry etch process using oxygen and chlorine containing plasmas. If the conductive material includes cobalt (Co), the subtractive etch process can illustratively employ an alternating chlorine/hydrogen plasma dry etch process. If the conductive material includes copper (Cu), the subtractive etch process can illustratively employ a dry etch process with hexafluoroacetylacetone via oxidation.

In an alternative embodiment, the conductive line 102-1 can be formed using a damascene trench formation process instead of the subtractive etch process shown in FIG. 1. That is, in contrast to forming the conductive line 102-1 by subtractively etching away material from a continuous block of conductive material, the conductive line 102-1 can be formed by forming a trench within, e.g., dielectric material, and filling the trench with conductive material to form the conductive line 102-1. Similar to the subtractive etch process, the conductive line 102-1 can be in the shape of a trapezoidal prism including two trapezoid bases connected by four rectangular lateral faces (e.g., each of the two trapezoidal bases can be in the form of an isosceles trapezoid in which the two legs connecting the top trapezoid base to the bottom trapezoid base have the same length). However, in this embodiment, the top trapezoid base would have a longer length than the bottom trapezoid base. After the conductive line 102-1 is formed, the via 104-1 and the skip via 106 can be formed using any suitable process in accordance with the embodiments described herein.

Figure 3:
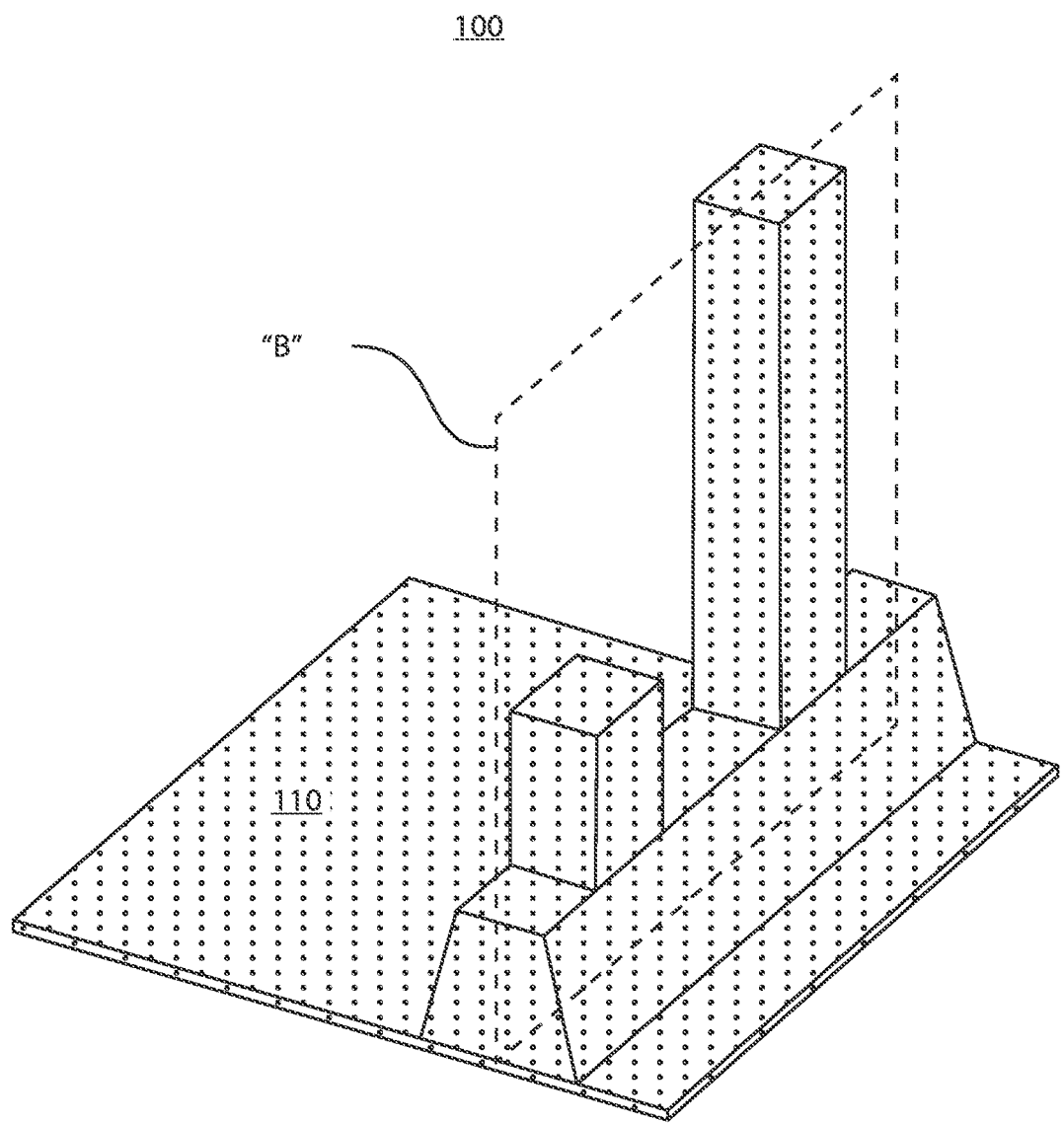
FIG. 3 is a perspective view of the formation of a barrier layer and a cap layer during the fabrication of the semiconductor device, in accordance with another embodiment of the present invention.
Figure 4:
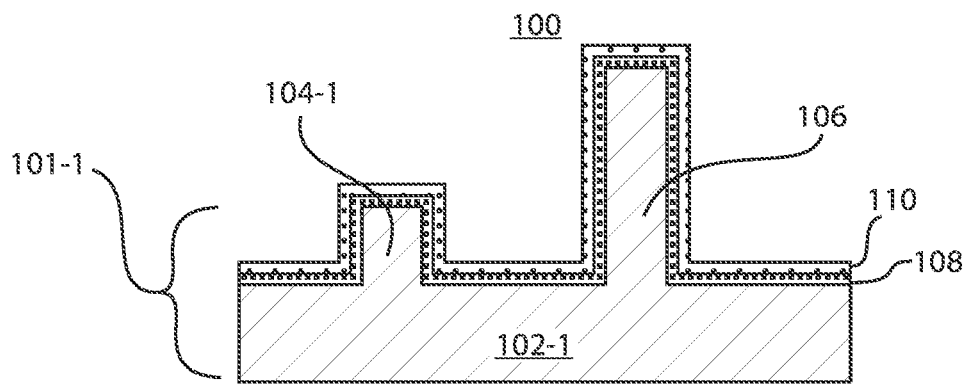
FIG. 4 is a cross-sectional view through the device shown in FIG. 3, in accordance with an embodiment of the present invention.

With reference to FIGS. 3 and 4, a barrier layer 108 and a cap layer 110 are formed along the first metallization level 101-1 including the conductive line 102-1 and the via 104-1, and the skip via 106. More specifically, FIG. 3 depicts a perspective view of the device 100 after the formation of the barrier layer 108 and the cap layer 110, and FIG. 4 depicts a cross-sectional view of the device 100 through plane "B" shown in FIG. 3.

The barrier layer 108 and the cap layer 110 can include any suitable materials in accordance with the embodiments described herein.

Examples of suitable materials for the barrier layer 108 include, but are not limited to, titanium nitride (TiN), tantalum nitride (TaN), tungsten nitride (WN), etc.

Examples of suitable materials for the cap layer 110 include, but are not limited to, silicon nitride (SiN), silicon carbonitride (SiCN), silicon oxynitride (SiON), silicon carbide (SiC), oxygen doped silicon carbide (ODC), etc.

Figure 5:
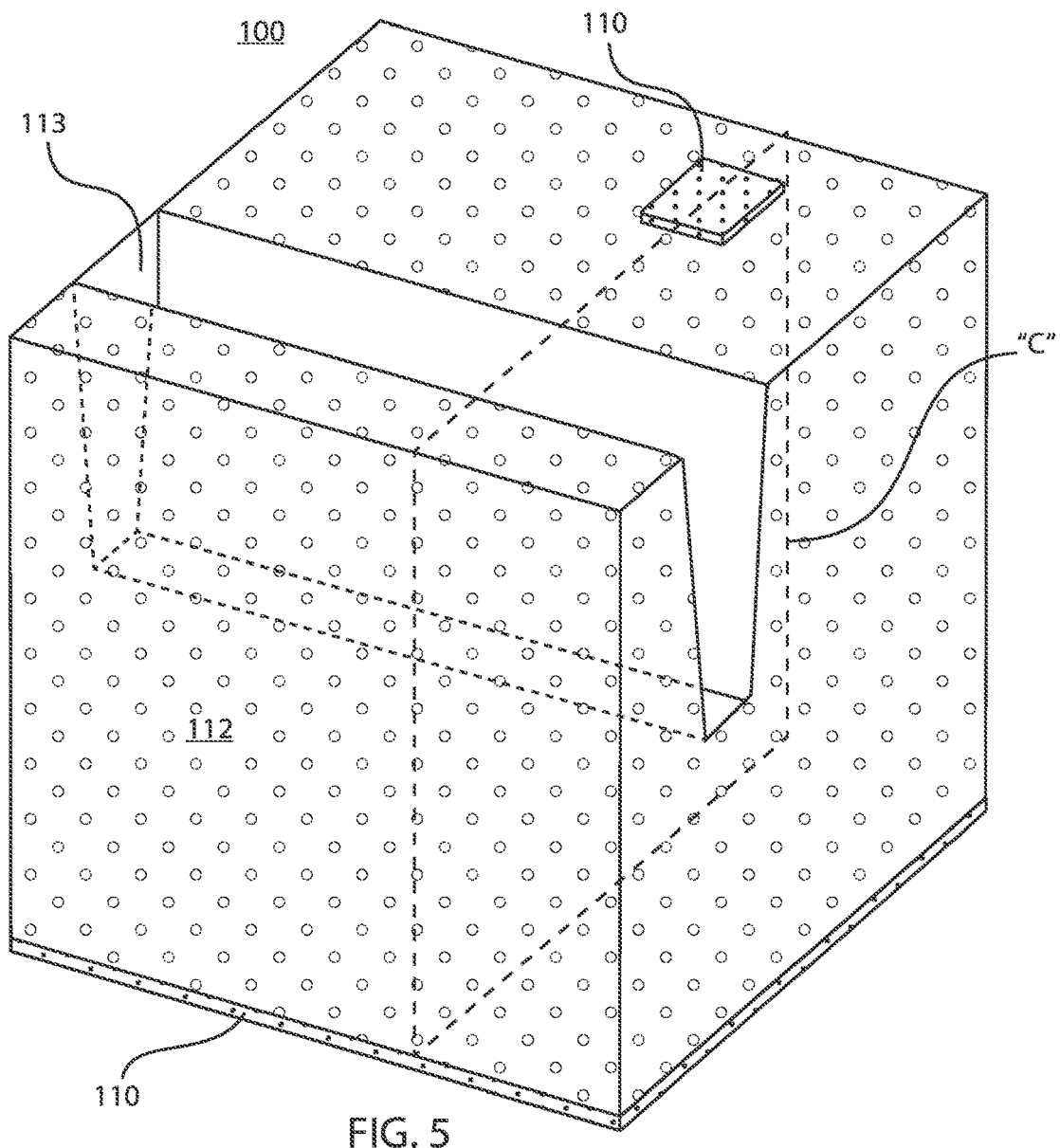
FIG. 5 is a perspective view of the formation of a dielectric layer and a trench within the dielectric layer during the fabrication of the semiconductor device, in accordance with an embodiment of the present invention.
Figure 6:
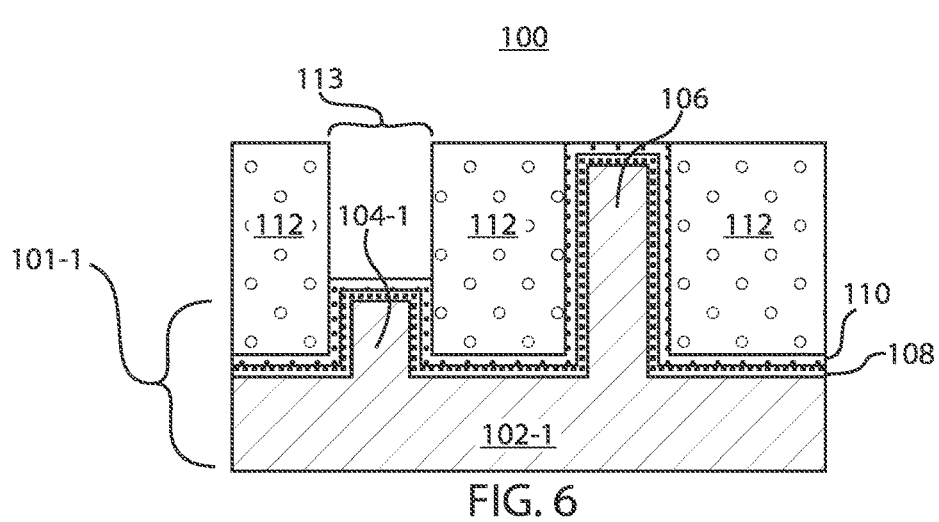
FIG. 6 is a cross-sectional view through the device shown in FIG. 5, in accordance with an embodiment of the present invention.

With reference to FIGS. 5 and 6, a dielectric layer 112 layer can be formed on the cap layer 110 to a height along the skip via 106, and a trench 113 can be formed within the dielectric layer above the via 104-1. More specifically, FIG. 5 depicts a perspective view of the device 100 after the formation of the trench 113, and FIG. 6 depicts a cross-sectional view of the device 100 through plane "C" shown in FIG. 5. In FIG. 5, at outline of the trench 113 including lines blocked by the dielectric layer 112 is shown for illustrative purposes only.

In this illustrative embodiment, a portion of the cap layer 110 formed on the upper surface of the skip via 106 extends slightly above the upper surface of the dielectric layer 112. However, in an alternative embodiment, the dielectric layer 112 can cover the portion of the cap layer 110 formed on the upper surface of the skip via 106.

The dielectric layer 112 can include any suitable materials in accordance with the embodiments described herein. In one embodiment, the dielectric layer 112 can include, e.g., a low-k dielectric material.

A low-k dielectric material is a material with a dielectric constant k less than the dielectric constant of $SiO_2$ at room temperature (e.g., about 20° C.-25° C.) and atmospheric pressure (e.g., about 1 atm). For example, a low-k dielectric material can have a dielectric constant of less than about 3.9. In one embodiment, the dielectric layer 112 can include an ultra-low k (ULK) dielectric material having a dielectric constant less than or equal to, e.g., about 2.5. For example, the dielectric layer 112 can include, e.g., spin-on or flowable dielectric material. The dielectric layer 112 can be formed using any suitable process in accordance with the embodiments described herein.

Figure 7:
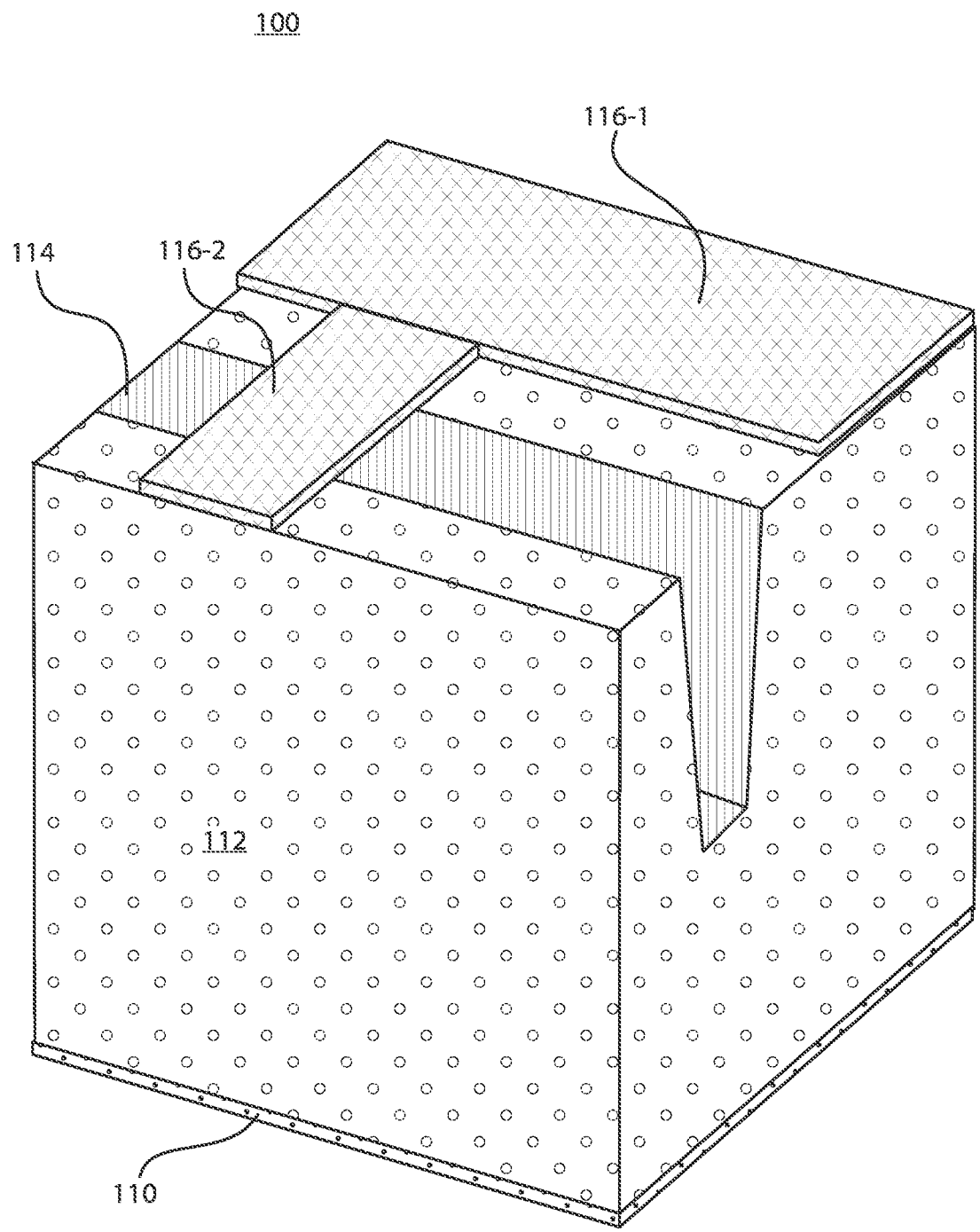
FIG. 7 is a perspective view of the formation of block masks during the fabrication of the semiconductor device, in accordance with an embodiment of the present invention.

With reference to FIG. 7, a perspective view is provided showing the formation of a conductive block 114 by forming conductive material within the trench 113 shown in FIGS. 5 and 6. Although not shown in FIG. 7, the conductive block 114 is formed on the via 104-1, and the upper surface of the conductive block 114 is substantially coplanar with the upper surface of the skip via. As will be described in further detail below with respect to FIG. 8, the conductive block 114 will be used to form a second metallization level including a second conductive line and a second via. The conductive block 114 can include any suitable material in accordance with the embodiments described herein. Examples of suitable materials that can be used to form the conductive block 114 include, but are not limited to, Cu, Ru, Co, etc.

In the illustrative embodiment shown in FIGS. 6-7, the conductive block 114 is formed using a damascene trench formation process, in which the trench 113 is formed in the dielectric layer 112, and the trench 113 is filled with conductive material. However, the conductive block 114 can be formed using any suitable process in accordance with the embodiments described herein.

As further shown in FIG. 7, a set of block masks 116-1 and 116-2 is formed blocking off respective regions of the device 100. As will be described in further detail below with reference to FIG. 8, the portions of the device 100 exposed in accordance with the block masks 116-1 and 116-2 will be subtractively etched to form a second metallization level of the device 100. More specifically, the block mask 116-1 is formed to protect a region including the skip via 106 and the block 116-2 is formed to protect a region including a portion of the conductive block 114 corresponding to a desired location of a via of the second metallization level during the subtractive etch process. The block masks 116-1 and 116-2 can include any suitable material in accordance with the embodiments described herein.

Figure 8:
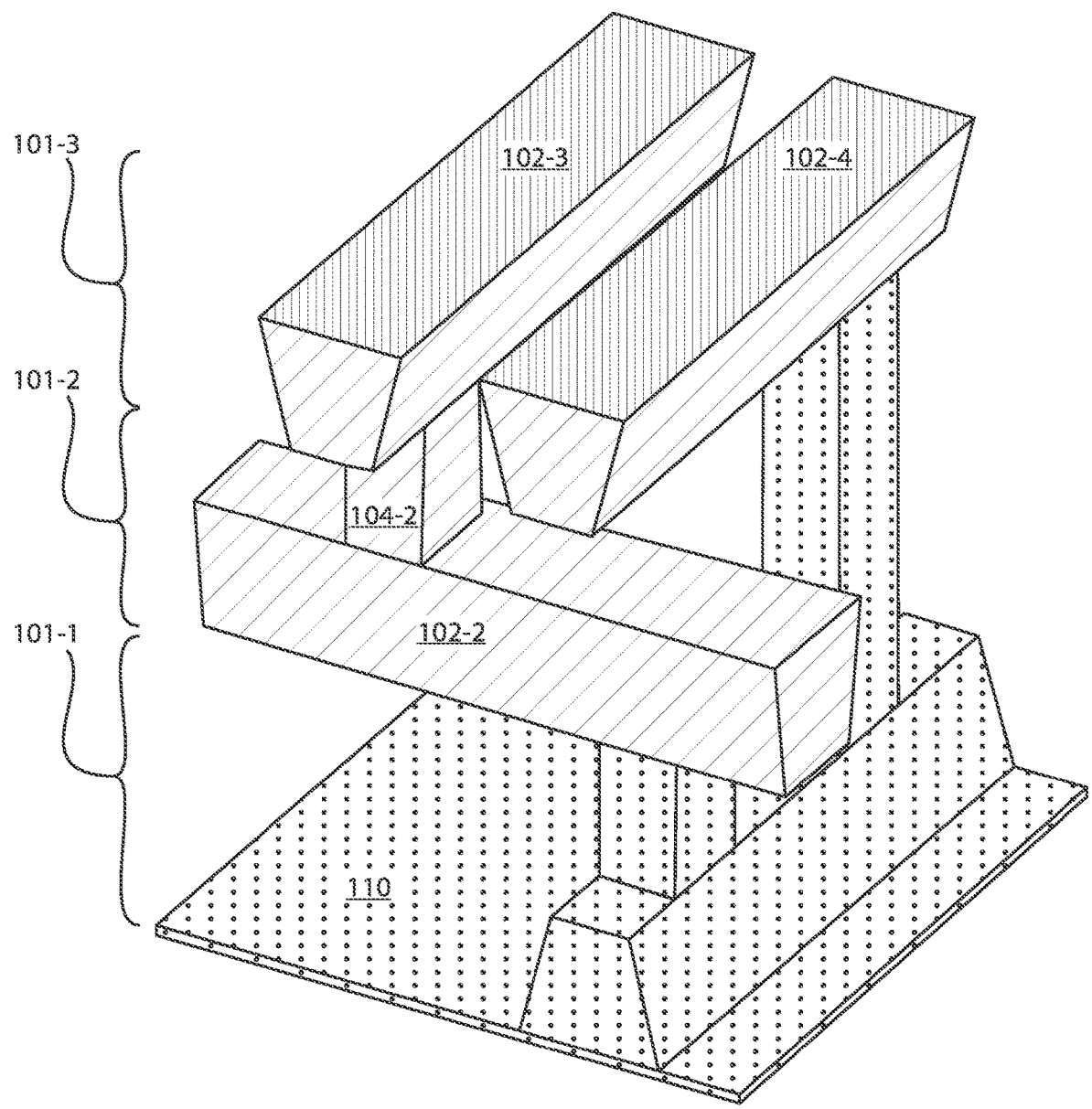
FIG. 8 is a perspective view of additional processing forming second and third metallization levels during the fabrication of a semiconductor device, in accordance with an embodiment of the present invention.

With reference to FIG. 8, a perspective view is provided showing the formation of a second metallization level 101-2 including a conductive line 102-2 and a via 104-2 from the conductive block 114, and a third metallization level 101-3 including a pair of conductive lines 102-3 and 102-4. The conductive lines 102-3 and 102-4 are formed on the via 104-2 and the skip via 106, respectively. That is, the skip via 106 is connected to the conductive line 102-1 and the conductive line 102-4, thereby bypassing the second metallization level 101-2. Although the dielectric layer 112 is still surrounding the device 100, the dielectric layer 112 has been omitted from FIG. 8 for the sake of clarity in order to show the relationships between the conductive lines 102-3 and 102-4 and the via 104-2 and the skip via 106, respectively.

Regarding the formation of the conductive line 102-2 and the via 104-2, a subtractive etch process can be used to remove exposed portions of the conductive block 114. The subtractive etch process used to form the via 104-2 can depend on the material used to form the conductive block 114. Similar to the upper surface of the conductive block 114 described above, the upper surface of the via 104-2 is substantially coplanar with the upper surface of the skip via 106. The subtractive etch process used herein can vary depending on the type of conductive material used. For example, if the conductive material includes ruthenium (Ru), the subtractive etch process can illustratively employ a dry etch process using oxygen and chlorine containing plasmas. If the conductive material includes cobalt (Co), the subtractive etch process can illustratively employ an alternating chlorine/hydrogen plasma dry etch process. If the conductive material includes copper (Cu), the subtractive etch process can illustratively employ a dry etch process with hexafluoroacetylacetone via oxidation.

In this illustrative embodiment, a damascene trench formation process is used to form the conductive lines 102-3 and 102-4. More specifically, a dielectric layer (not shown) can be formed on the via 104-2 and the skip via 106, a pair of trenches corresponding to the conductive lines 102-3 and 102-4 are etched, and conductive material is formed within the trenches to form the conductive lines 102-3 and 102-4. Similar to the dielectric layer 112, the dielectric layer in which the conductive lines 102-3 and 102-4 are formed has been omitted from FIG. 8 for the sake of clarity to show the relationships between the components of the device 100. The dielectric layer can include any suitable material in accordance with the embodiments described herein. In one embodiment, the dielectric layer can include, e.g., a low-k dielectric material. For example, the dielectric layer can include a ULK dielectric material such as, e.g., spin-on or flowable dielectric material. The dielectric layer can include the same or similar material as the dielectric layer 112, or a different material than the dielectric layer 112. The dielectric layer can be formed using any suitable process in accordance with the embodiments described herein.

The conductive lines 102-3 and 102-4 can include any suitable material in accordance with the embodiments described herein. Examples of suitable materials that can be used to form the conductive lines 102-3 and 102-4 include, but are not limited to, Cu, Ru, Co, etc. In one embodiment, the conductive lines 102-3 and 102-4 can be surrounded by a barrier layer and/or a cap layer (not shown).

In the embodiment shown in FIG. 8, as mentioned above, a damascene trench formation process is used to form the conductive lines 102-3 and 102-4. The conductive lines 102-3 and 102-4 are in the shape of a trapezoidal prism (e.g., isosceles trapezoidal prism) including two trapezoid bases connected by four rectangular lateral faces, with the top bases having a shorter length than the bottom bases.

In an alternative embodiment, the conductive lines 102-3 and 102-4 can be formed using a subtractive etch process by etching a continuous block of conductive material. Similar to the conductive lines 102-1 and 102-2 described above with reference to FIGS. 1 and 6, respectively, the conductive lines 102-3 and 102-4 in this alternative embodiment can be in the shape of a trapezoidal prism (e.g., isosceles trapezoidal prism) including two trapezoid bases connected by four rectangular lateral faces, with the top bases having a shorter length than the bottom bases.

In another embodiment, one of the conductive lines 102-3 and 102-4 can be formed using a damascene trench formation process, and the other one of the conductive lines 102-3 and 102-4 can be formed using a subtractive etch process.

FIGS. 1-8 have described an embodiment of device including a skip via formed using a subtractive etch process. Another embodiment of a device including a skip via formed using a subtractive etch process will now be described below with reference to FIGS. 9-13. It is assumed that the process flow depicted in FIGS. 9-13 begins from the device shown in FIG. 4.

Figure 9:
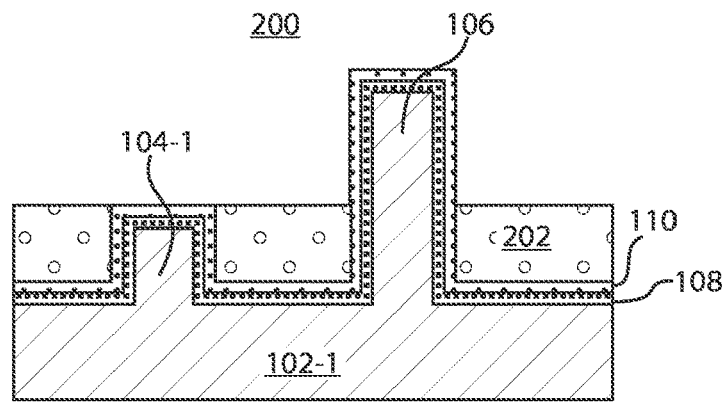
FIG. 9 is a cross-sectional view of the formation of a dielectric layer during the fabrication of a semiconductor device, in accordance with another embodiment of the present invention.

With reference to FIG. 9, a cross-sectional view of a device 200 is provided showing the formation of a dielectric layer 202. Instead of a dielectric layer formed to a height of the cap layer 110 disposed on the skip via 106, as shown by the dielectric layer 112 described above with reference to FIG. 3, the dielectric layer 202 is formed to a height of the cap layer 110 disposed on the via 104-1. The dielectric layer 202 can be formed using any suitable process in accordance with the embodiments described herein, and can include any suitable material in accordance with the embodiments described herein. For example, the dielectric layer 202 can include the same or similar material as the dielectric layer 112 described above with reference to FIG. 3.

Figure 10:
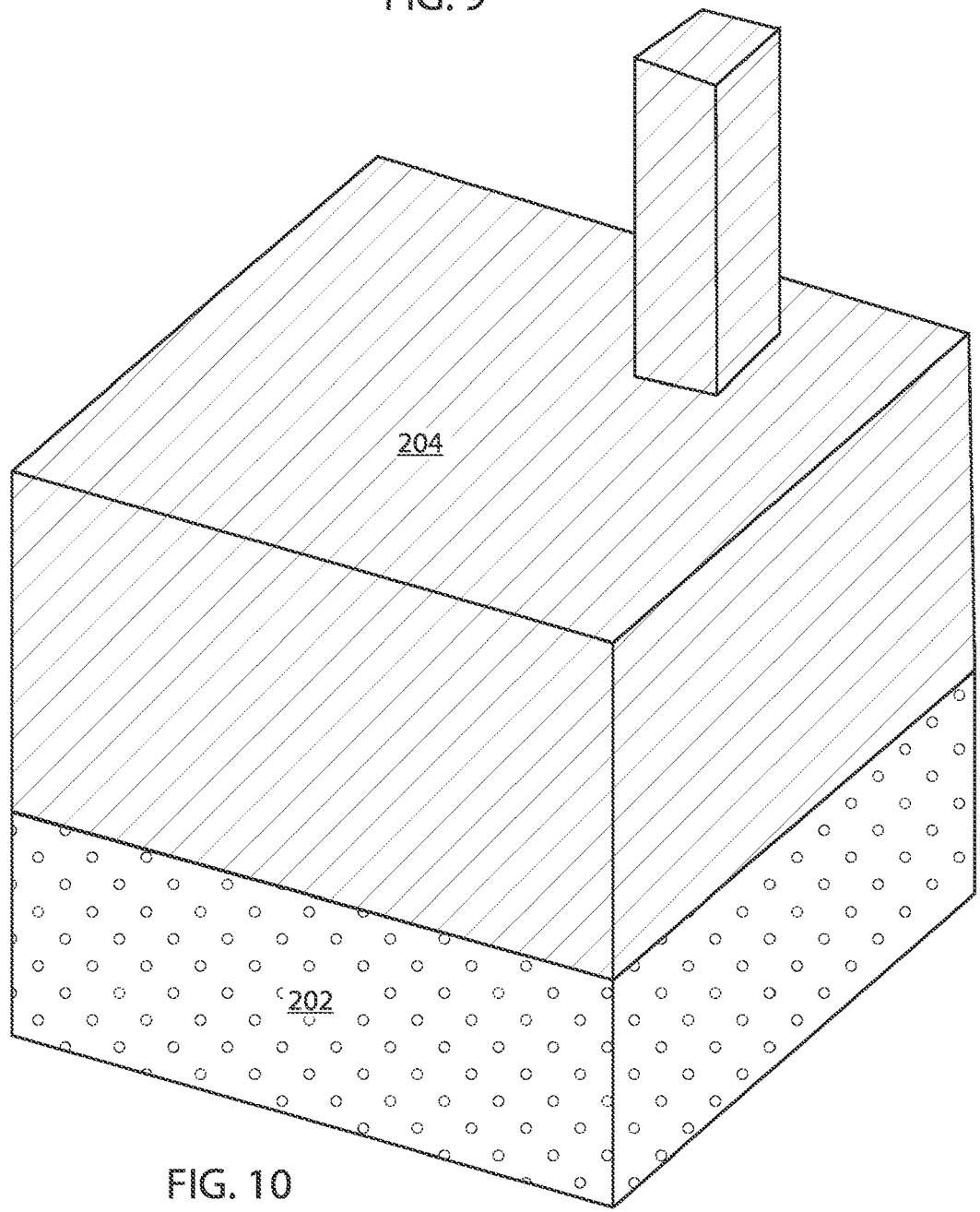
FIG. 10 is perspective view of the formation of conductive material on the dielectric layer during the fabrication of the semiconductor device, in accordance with another embodiment of the present invention.

With reference to FIG. 10, a perspective view is provided showing the formation of conductive material 204 on the dielectric layer 202 and the upper surface of the cap layer 110 disposed on the skip via 106 (not shown). More specifically, the conductive material 204 can be epitaxially grown. The conductive material 204 can include any suitable material in accordance with the embodiments described herein. Examples of suitable materials that can be used to form the conductive material include, but are not limited to, Cu, Ru, Co, etc.

Figure 11:
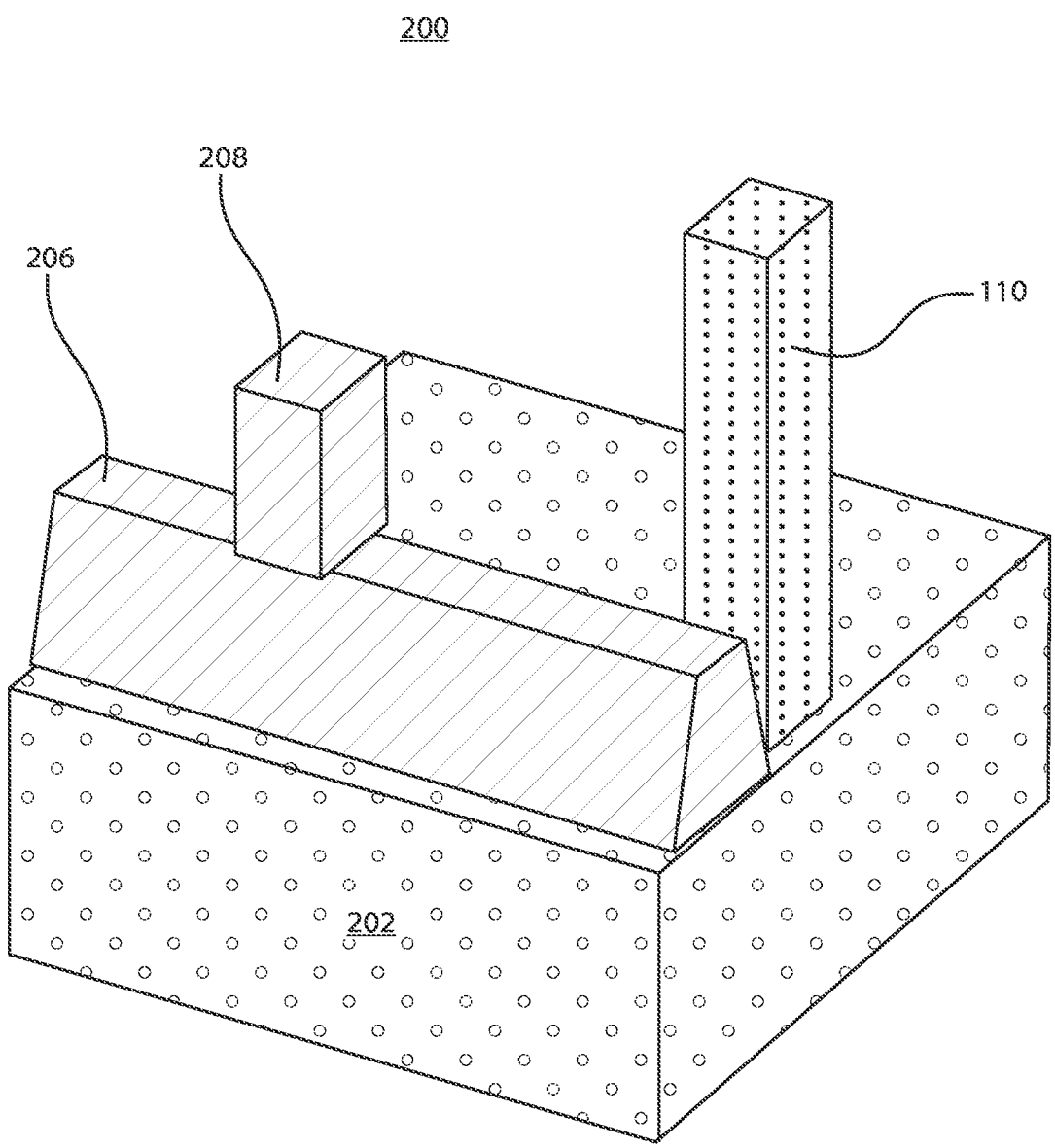
FIG. 11 is a perspective view of the formation of second metallization layer during the fabrication of the semiconductor device, in accordance with another embodiment of the present invention.

With reference to FIG. 11, a perspective view is provided showing the formation of a conductive line 206 and a via 208 from the conductive material 204. The upper surface of the via 208 is substantially coplanar with the surface of the cap layer 110 disposed on the skip via 106. Any suitable process can be used to form the conductive line 206 and the via 208 from the conductive block in accordance with the embodiments described herein. For example, the conductive line 206 and the via 208 can be formed by performing using a subtractive etch and via formation processes that remove the conductive block 204 in the manner shown in FIG. 11.

Figure 12:
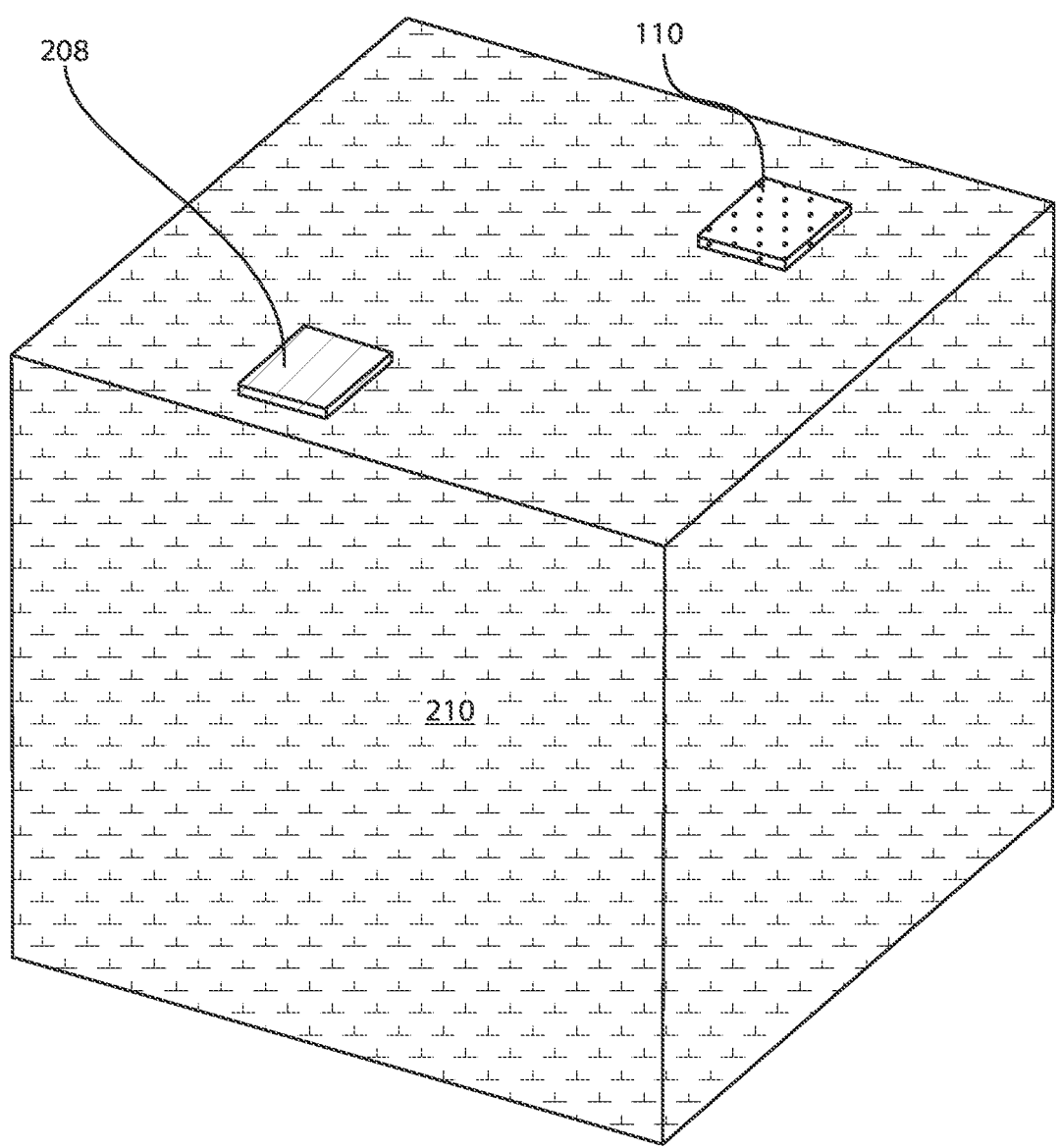
FIG. 12 is a perspective view of the formation of another dielectric layer during the fabrication of the semiconductor device, in accordance with another embodiment of the present invention.

With reference to FIG. 12, a perspective view is provided showing the removal of the remaining portions (e.g., damaged portions) of the dielectric layer 202, and the formation of a new dielectric layer 210 is formed to a height of the upper surfaces of the via 208 and the cap layer 110 formed on the skip via 106 (not shown). The dielectric layer 210 can include any suitable material in accordance with the embodiments described herein.

In one embodiment, the dielectric layer 210 can include, e.g., a low-k dielectric material. For example, the dielectric layer 212 can include a ULK dielectric material such as, e.g., spin-on or flowable dielectric material. The dielectric layer 210 can include the same or similar material as the dielectric layer 202, or a different dielectric material than the dielectric layer 202. The dielectric layer 210 can be formed using any suitable process in accordance with the embodiments described herein.

Figure 13:
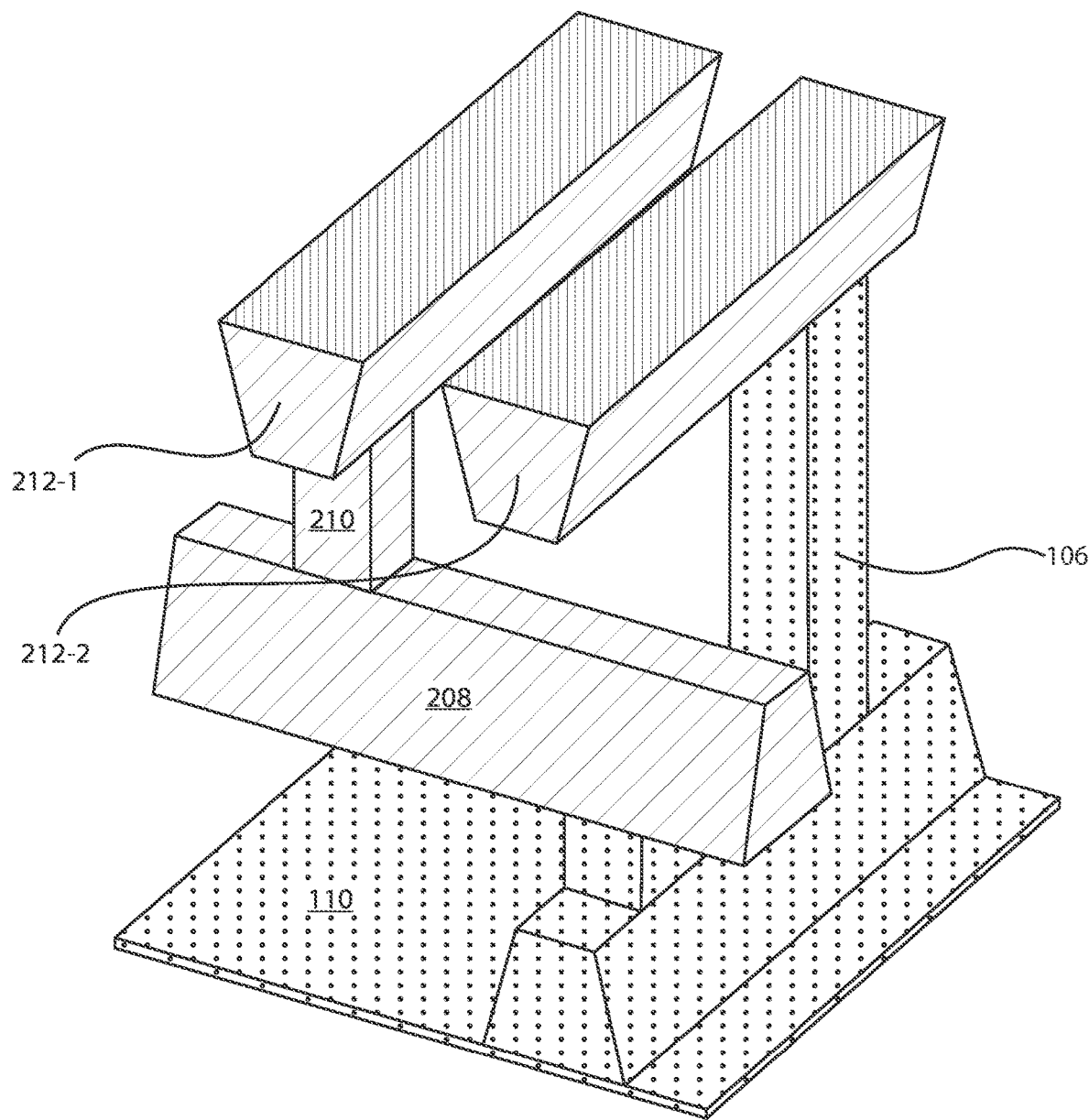
FIG. 13 is a perspective view of additional processing forming a third metallization level during the fabrication of the semiconductor device, in accordance with another embodiment of the present invention.

With reference to FIG. 13, a perspective view is provided showing additional processing performed to form a third metallization level including a pair of conductive lines 212-1 and 212-2. The conductive lines 212-1 and 212-2 are formed on the via 210 and the skip via 106, respectively. That is, the skip via 106 is connected to the conductive line 102-1 and the conductive line 212-2, thereby bypassing the second metallization level 101-2. Although the dielectric layer 202 is still surrounding the device 200, the dielectric layer 202 has also been omitted from FIG. 13 for the sake of clarity in order to show the relationships between the conductive lines 212-1 and 212-2 and the via 210 and the skip via 106, respectively.

The conductive lines 212-1 and 212-2 can include any suitable material in accordance with the embodiments described herein. Examples of suitable materials that can be used to form the conductive lines 212-1 and 212-2 include, but are not limited to, Cu, Ru, Co, etc. In one embodiment, the conductive lines 212-1 and 212-2 can be surrounded by a barrier layer and/or a cap layer (not shown).

In this illustrative embodiment, similar to FIG. 8, a damascene trench formation process is used to form the conductive lines 212-1 and 212-2. More specifically, a dielectric layer (not shown) can be formed on the via 210 and the skip via 106, a pair of trenches corresponding to the conductive lines 212-1 and 212-2 are etched, and conductive material is formed within the trenches to form the conductive lines 212-1 and 212-2. Similar to the dielectric layer 202, the dielectric layer in which the conductive lines 212-1 and 212-2 are formed has been omitted from FIG. 13 for the sake of clarity to show the relationships between the components of the device 200. The dielectric layer can include any suitable material in accordance with the embodiments described herein. In one embodiment, the dielectric layer can include, e.g., a low-k dielectric material. For example, the dielectric layer can include a ULK dielectric material such as, e.g., spin-on or flowable dielectric material. The dielectric layer can include the same or similar material as the dielectric layer 202, or a different material than the dielectric layer 202. The dielectric layer can be formed using any suitable process in accordance with the embodiments described herein.

In an alternative embodiment, the conductive lines 212-1 and 212-2 can be formed using a subtractive etch process by etching a continuous block of conductive material. Accordingly, the conductive lines 212-1 and 212-2 can be in the shape of a trapezoidal prism (e.g., isosceles trapezoidal prism) including two trapezoid bases connected by four rectangular lateral faces, with the top bases having a shorter length than the bottom base.

In another embodiment, one of the conductive lines 212-1 and 212-2 can be formed using a damascene trench formation process, and the other one of the conductive lines 212-1 and 212-2 can be formed using a subtractive etch process.

Figure 14:
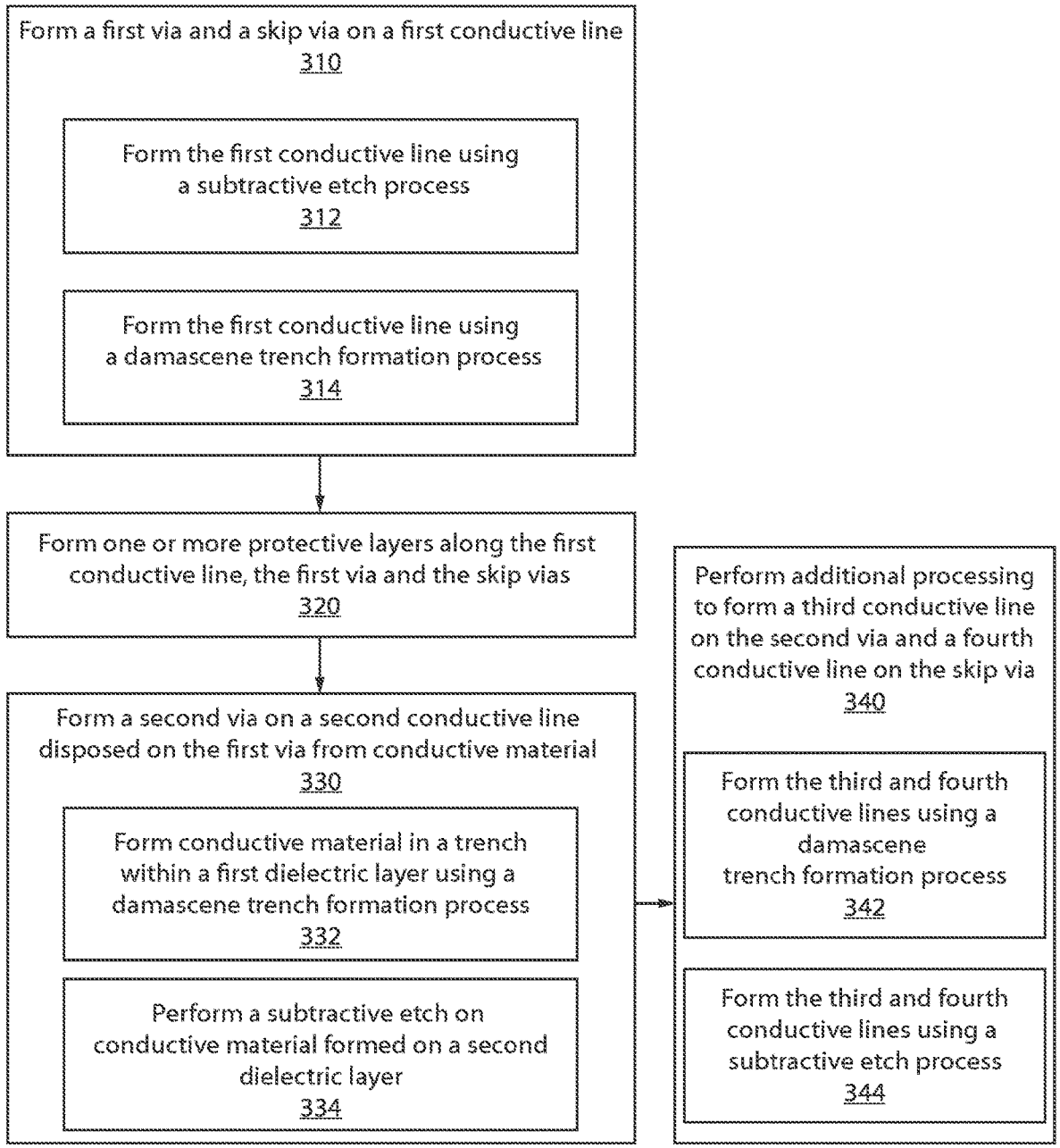
FIG. 14 is a block/flow diagram showing a method for forming a semiconductor device, in accordance with an embodiment of the present invention.

With reference to FIG. 14, a block/flow diagram is provided illustrating a system/method 300 for fabricating a semiconductor device.

At block 310, a first via and a skip via are formed on a first conductive line. More specifically, a block of conductive material having a suitable thickness can be subtractively etched to form the first via and the skip via on the first conductive line. The first conductive line and the first via correspond to a first metallization level of the device. The first conductive line, the first via and the skip via can include any suitable material(s) in accordance with the embodiments described herein. Examples of suitable materials that can be used to form the first conductive line, the first via and the skip via include, but are not limited to, Ru, Co and Cu.

Any suitable process can be used to form the first conductive line, the first via and the skip via in accordance with the embodiments described herein.

For example, in one embodiment, forming the first via and the skip via on the first conductive line includes, at block 312, forming the first conductive line using a subtractive etch process. In this embodiment, a subtractive trench etch formation process can be performed on a block of conductive material to form a base, a subtractive etch can be performed on the base to form first and second conductive pillars on the conductive line, the first conductive pillar can be protected by a block mask, and a subtractive etch can be performed using the block mask to form the first conductive via from the second conductive pillar. The first conductive pillar is the skip via.

In another embodiment, forming the first conductive line, the first via and the skip via includes, at block 314, forming the first conductive line using a damascene trench formation process. In this embodiment, a trench can be formed within a dielectric layer, and conductive material can be formed within the trench to form the first conductive line. The first via and the skip via can then be formed on the first conductive line using any suitable process in accordance with the embodiments described herein.

Further details regarding blocks 310-314 are described above with reference to FIGS. 1-2.

At block 320, one or more protective layers are formed along the first conductive line, the first via and the skip via. The one or more protective layers can include at least one of a barrier layer and a cap layer. The one or more protective layers can include any suitable material(s) in accordance with the embodiments described herein. Further details regarding block 320 are described above with reference to FIGS. 3-4.

At block 330, a second via is formed on a second conductive line disposed on the first via from conductive material. The second via and the second conductive line correspond to a second metallization level of the device. The conductive material used to form the second via and the second conductive line can include any suitable materials in accordance with the embodiments described herein. Examples of suitable materials that can be used to form the second conductive line and the second via include, but are not limited to, Ru, Co and Cu.

Any suitable process can be used to form the second via and the second conductive line in accordance with the embodiments described herein.

For example, in one embodiment, forming the second via on the second conductive line includes, at block 332, forming the conductive material in a trench within a first dielectric layer using a damascene trench formation process. More specifically, the first dielectric layer can be formed to a height of the one or more protective layers along the upper surface of the skip via, the trench can be formed within the dielectric layer to the one or more protective layers formed on the upper surface of the first via, the conductive material can be formed within the trench, and the conductive material can be etched using block masks to form the second conductive line and the second via.

In another embodiment, forming the second via on the second conductive line includes, at block 334, performing a subtractive etch process on conductive material formed on a second dielectric layer. More specifically, in this embodiment, the second dielectric layer can be formed to a height of the one or more protective layers along the upper surface of the first via (as opposed to the skip via as described in block 332), the conductive material is formed on the second dielectric layer covering exposed portions of the one or more protective layers, and the conductive material is subtractively etched to form the second conductive line and the second via.

Further details regarding blocks 330-334 are described above with reference to FIGS. 5-11.

At block 340, additional processing is performed to form a third conductive line on the second via and a fourth conductive line on the skip via. The third and fourth conductive lines correspond to a third metallization level of the device. The third and fourth conductive lines can include any suitable material(s) in accordance with the embodiments described herein. Examples of suitable materials that can be used to form the third and fourth conductive lines include, but are not limited to, Ru, Co, Cu, etc.

The additional processing can include any suitable processes in accordance with the embodiments described herein.

In one embodiment, performing the additional processing can include, at block 342, forming the third and fourth conductive lines using a damascene trench formation process.

For example, in the embodiment described above with reference to block 332, a third dielectric layer can be formed on the first dielectric layer, a pair of trenches can then be etched within the third dielectric layer, by and the trenches can be filled with conductive material.

As another example, in the embodiment described above with reference to block 334, the second dielectric layer can be replaced with a fourth dielectric layer formed to a height of the second via and the one or more protective layers on the upper surface of the skip via, a fifth dielectric layer can be formed on the fourth dielectric layer, a pair of trenches can be etched within the fifth dielectric layer, and the pair of trenches with conductive material.

In another embodiment, performing the additional processing can include, at block 344, forming the third and fourth conductive lines using a subtractive etch process (as opposed to damascene trench etch process).

Further details regarding blocks 340-344 are described above with reference to FIGS. 8, 12 and 13.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device including a skip via connection between metallization levels, comprising:
   subtractively etching first conductive material to form a first via and a skip via on a first conductive line, the first via and the first conductive line being included within a first metallization level, wherein the skip via is used to connect the first metallization level to a third metallization level above a second metallization level; and
   forming, on the first via from second conductive material, a second via disposed on a second conductive line, the second via and the second conductive line being included within the second metallization level.

2. The method of claim 1, further comprising forming the first conductive line using a subtractive etch process.

3. The method of claim 1, further comprising forming the first conductive line using a damascene trench formation process.

4. The method of claim 1, further comprising, prior to forming the second via on the second conductive line disposed on the first via, forming one or more protective layers along the first conductive line, the first via and the skip via.

5. The method of claim 4, wherein the one or more protective layers include a barrier layer and a cap layer.

6. The method of claim 1, wherein forming the second via on the second conductive line further includes forming the second conductive material in a trench using a damascene trench formation process.

7. The method of claim 1, wherein forming the second via on the second conductive line disposed on the first via further includes subtractively etching the second conductive material.

8. The method of claim 1, further comprising performing additional processing to form a third conductive line on the second via and a fourth conductive line on the skip via, the third and fourth conductive lines being included within the third metallization level.

9. The method of claim 8, wherein the third and fourth conductive lines are formed using a damascene trench formation process.

10. The method of claim 8, wherein the third and fourth conductive lines are formed using a subtractive etch process.

11. A semiconductor device including a skip via connection between metallization levels, comprising:
    a first conductive line having an upper surface with a smaller width than a respective lower surface;
    a first via and a skip via disposed on the first conductive line, the first via and the first conductive line being included within a first metallization level, wherein the skip via connects a first metallization level to a third metallization level above a second metallization level; and
    the second metallization level including a second via on a second conductive line disposed on the first via.

12. The device of claim 11, further comprising a barrier layer and a cap layer disposed along the first conductive line, the first via and the skip via.

13. The device of claim 11, wherein the third metallization level includes a third conductive line disposed on the second via and a fourth conductive line disposed on the skip via.

14. The device of claim 13, wherein the third and fourth conductive lines have respective upper surfaces with a smaller width than respective lower surfaces.

15. A semiconductor device including a skip via connection between metallization levels, comprising:
    a first conductive line having an upper surface with a larger width than a respective lower surface;
    a first via and a skip via disposed on the first conductive line, the first via and the first conductive line being included within a first metallization level, wherein the skip via connects a first metallization level to a third metallization level above a second metallization level; and
    the second metallization level including a second via on a second conductive line disposed on the first via.

16. The device of claim 15, further comprising a barrier layer and a cap layer disposed along the first conductive line, the first via and the skip via.

17. The device of claim 15, wherein the third metallization level includes a third conductive line disposed on the second via and a fourth conductive line disposed on the skip via.

18. The device of claim 17, wherein the third and fourth conductive lines have respective upper surfaces with a larger width than respective lower surfaces.

19. The device of claim 17, wherein the third and fourth conductive lines have respective upper surfaces with a smaller width than respective lower surfaces.

20. The device of claim 11, wherein the first conductive line has a length along a first dimension and the second conductive line has a length along a second dimension, perpendicular to the first dimension.

* * * * *